(12) United States Patent
Iwasaki et al.

(10) Patent No.: US 9,134,438 B2
(45) Date of Patent: Sep. 15, 2015

(54) RADIATION DETECTING ELEMENT USING OXIDE CRYSTAL AND METHOD OF MANUFACTURING OXIDE CRYSTAL

(71) Applicants: The University of Tokyo, Tokyo (JP); CANON KABUSHIKI KAISHA, Tokyo (JP)

(72) Inventors: Tatsuya Iwasaki, Machida (JP); Tatsuya Saito, Kawasaki (JP); Toru Den, Tokyo (JP); Yoshinobu Nakamura, Tokyo (JP); Hidenori Takagi, Tokyo (JP)

(73) Assignees: Canon Kabushiki Kaisha, Tokyo (JP); The University of Tokyo, Tokyo (JP)

( * ) Notice: Subject to any disclaimer, the term of this patent is extended or adjusted under 35 U.S.C. 154(b) by 0 days.

(21) Appl. No.: 14/301,573

(22) Filed: Jun. 11, 2014

(65) Prior Publication Data

US 2014/0374609 A1    Dec. 25, 2014

(30) Foreign Application Priority Data

Jun. 20, 2013   (JP) .................................. 2013-130012

(51) Int. Cl.
   *G01T 1/24*      (2006.01)
   *H01L 27/146*    (2006.01)
   *H01L 31/18*     (2006.01)
   *H01L 31/032*    (2006.01)
   *H01L 31/08*     (2006.01)
   *G01T 1/26*      (2006.01)

(52) U.S. Cl.
   CPC ... *G01T 1/24* (2013.01); *G01T 1/26* (2013.01); *H01L 27/14683* (2013.01); *H01L 31/032* (2013.01); *H01L 31/085* (2013.01)

(58) Field of Classification Search
   CPC ........... G01T 1/24; G01T 1/26; H01L 31/032; H01L 31/085; H01L 27/14683
   See application file for complete search history.

(56) References Cited

U.S. PATENT DOCUMENTS 6,512,233 B1   1/2003   Sato et al.
7,132,666 B2   11/2006  Nakata et al.

FOREIGN PATENT DOCUMENTS

JP   2001-242255 A   9/2001
WO   02/063340 A1    8/2002

OTHER PUBLICATIONS

Z. M. Jarzebski et al., "Physical Properties of SnO2 Materials: I. Preparation and Defect Structure," 123(7) J. Electrochem. Soc. 199C-205C (1976).
Masahiro Nagasawa et al., "Properties of Oxidized SnO2 Single Crystals," 10 Jpn. J. Appl. Phys. 727-731 (Jun. 1971).
C. G. Fonstad et al., "Vapor Phase Growth of Stannic Oxide Single Crystals," 116(9) J. Electrochem. Soc. 1269-1271 (1969).
Z. M. Jarzebski et al., "Physical Properties of SnO2 Materials: II. Electrical Properties," 123(9) J. Electrochem. Soc. 299C-310C (Sep. 1976).

*Primary Examiner* — Mark R Gaworecki
(74) *Attorney, Agent, or Firm* — Fitzpatrick, Cella, Harper & Scinto (57) ABSTRACT

Provided is a radiation detecting element, including: a semiconductor layer including a tin oxide crystal; and a detecting unit configured to detect, as an electrical signal, charges generated in the semiconductor layer when the semiconductor layer is irradiated with radiation, in which a resistivity of the semiconductor layer is $10^7$ Ω·cm or more.

17 Claims, 8 Drawing Sheets

RADIATION DETECTING ELEMENT USING OXIDE CRYSTAL AND METHOD OF MANUFACTURING OXIDE CRYSTAL

BACKGROUND OF THE INVENTION

1. Field of the Invention

The present invention relates to a radiation detecting element using a tin oxide crystal and a method of manufacturing semiconductor including a tin oxide crystal having a high resistivity, which is applicable to the radiation detecting element.

2. Description of the Related Art

As a radiation detecting apparatus used to detect X-ray or γ-ray in medical or industrial application, a radiation detecting apparatus including a detecting portion using semiconductor such as Si or Ge has been known. However, in the case of using Si and Ge, a thick semiconductor layer is required, because Si or Ge has a long absorption length of the X-ray, and hence there is a constraint in downsizing the apparatus or making the apparatus thinner so that a usage range of the apparatus is limited. In Japanese Patent Application Laid-Open No. 2001-242255, a radiation detecting apparatus using CdTe, CdZnTe, $HgI_2$, $PbI_2$, amorphous selenium (a-Se), or the like, as a material having a relatively short absorption length of the X-ray, has been described.

Further, acquisition of an image of radiation is performed by using a sensor array including two-dimensionally arrayed radiation detecting elements. For example, an X-ray image sensor has been developed, which includes transistors and radiation detecting elements (photoconductive elements) formed on a substrate in an arrayed manner, as an image detecting apparatus for X-ray diagnosis for chest or general radiography. There is a system of converting incident X-ray absorbed in a photoconductive layer such as a-Se into charge signals by using a high electric field, accumulating the charges in a capacitor, and reading out the accumulated charges through a transistor.

In order to detect the incident X-ray completely, a sufficiently thick photoconductive layer is required to absorb the X-ray. For example, in the case of using a-Se as the photoconductive material for detecting the X-ray, the a-Se is formed as thick as about 1 mm. Further, in order to collect charges generated in the a-Se to arrive at electrodes without being trapped in a defect level in the film, a voltage as large as about 10 kV is applied between the electrodes.

However, in the materials such as a-Se, CdTe, $HgI_2$, $PbI_2$, and the like, which have been considered before, a highly toxic element is used.

Although there has been a report of using ZnO as a material having low toxicity and small environmental load, it has not yet led to practical use due to its low sensitivity and large dark current.

SUMMARY OF THE INVENTION

According to one embodiment of the present invention, there is provided a radiation detecting element, including: a semiconductor layer including a tin oxide crystal; and a detecting unit configured to detect, as an electrical signal, charges generated in the semiconductor layer when the semiconductor layer is irradiated with radiation, in which a resistivity of the semiconductor layer is $10^7$ Ω·cm or more.

Further features of the present invention will become apparent from the following description of exemplary embodiments with reference to the attached drawings.

DESCRIPTION OF THE EMBODIMENTS

The inventors of the present invention have found that a tin oxide can be used to detect radiation (X-ray) while studying a radiation detecting element using a material having low toxicity and small environmental load. The inventors of the present invention have further found that a radiation detecting element having higher detection sensitivity and smaller dark current than those of a radiation detecting element using ZnO can be achieved by using the tin oxide.

In order to achieve an excellent X-ray detecting element, it is desired that the material for the detection have high performance of absorbing the X-ray, high current sensitivity with respect to the X-ray, and high resistivity to reduce the dark current.

Exemplary embodiments of the present invention are described below with reference to the accompanying drawings.

Configuration of Radiation Detecting Apparatus

Figure 3A:
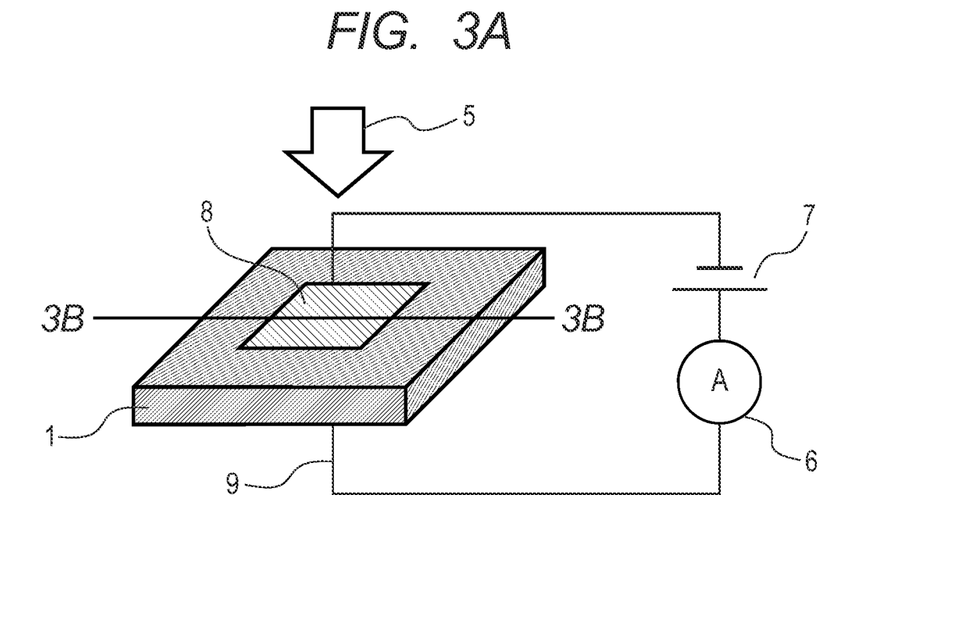
FIG. 3A is a schematic diagram illustrating another configuration of the X-ray detecting element according to the embodiment of the present invention.
Figure 3B:
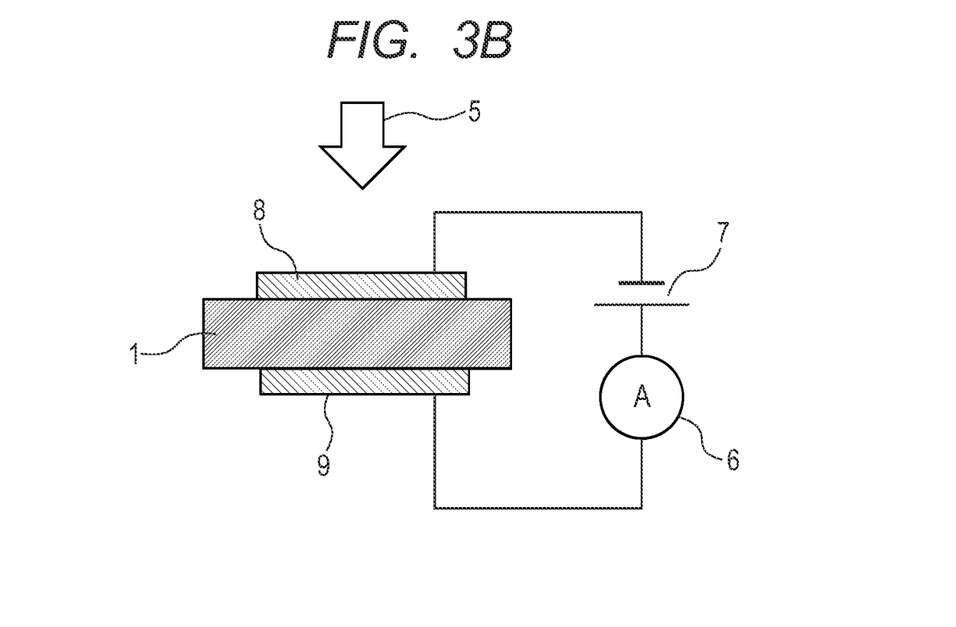
FIG. 3B is a schematic cross-sectional view illustrating the another configuration of the X-ray detecting element according to the embodiment of the present invention.

A radiation detecting element according to an embodiment of the present invention is described with reference to FIGS. 3A and 3B. As illustrated in FIGS. 3A and 3B, the radiation detecting element according to this embodiment includes a semiconductor layer 1 (radiation detecting portion) formed of $SnO_2$ that is a form of the tin oxide, an upper electrode 8, and a lower electrode 9. A bias power source 7 and an ammeter 6 are connected in series to the radiation detecting element. The semiconductor layer 1 is irradiated with a radiation (X-ray) 5. In FIG. 3B, a cross-sectional view taken along the line 3B-3B of FIG. 3A is shown, in order to make a wiring connection to the lower electrode 9 clear.

When the semiconductor layer 1 is irradiated with the radiation, the radiation detecting element according to this embodiment detects charges generated in the semiconductor layer 1 as electrical signals. By being irradiated with the radiation, the charges (electrons and holes) are generated in the semiconductor layer that includes $SnO_2$. By measuring current originated from the charges with an external circuit, the electrical signals having correlation with intensity of the radiation can be detected. In FIGS. 3A and 3B, the bias power source 7 and the ammeter 6 constitute the external circuit.

Figure 2:
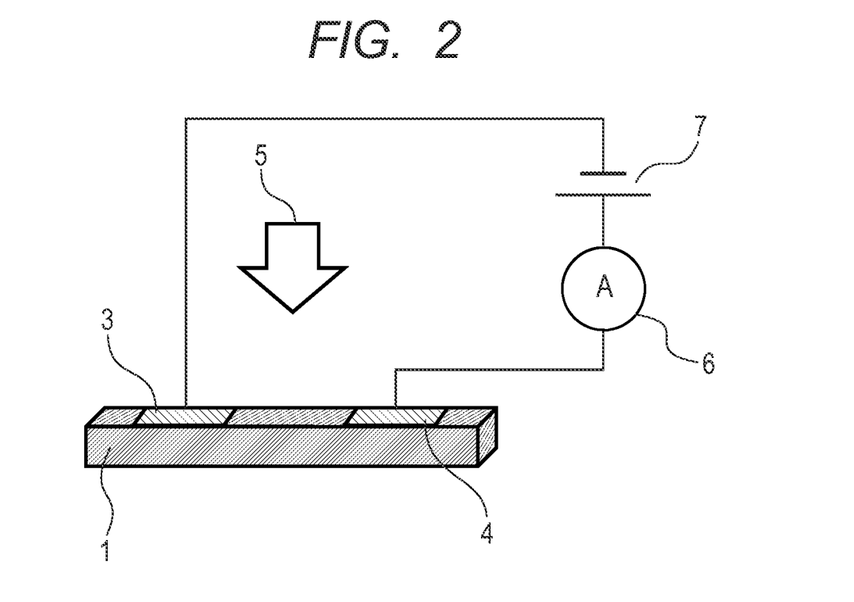
FIG. 2 is a schematic diagram illustrating a configuration of an X-ray detecting element according to the embodiment of the present invention.

In FIGS. 3A and 3B, the first electrode (upper electrode 8) and the second electrode (lower electrode 9) are arranged facing each other across the semiconductor layer 1. Alternatively, as illustrated in FIG. 2, electrodes 3 and 4 can be arranged with a predetermined interval on a surface of a semiconductor layer including $SnO_2$. In FIG. 2, the radiation detecting element includes $SnO_2$ 1 and the electrodes 3 and 4. The bias power source 7 and the ammeter 6 are connected in series to the radiation detecting element, and the $SnO_2$ 1 is irradiated with the radiation 5. However, in terms of being able to stably capture the generated charges with an electrode having a wide area, the configuration illustrated in FIGS. 3A and 3B is preferred.

The resistivity of the semiconductor layer including $SnO_2$ is $10^7$ Ω·cm or more, and the resistivity is preferred to be $10^9$ Ω·cm or more. By using $SnO_2$ having this resistivity, a radiation detecting element having small dark current can be achieved. $SnO_2$ having this resistivity can be manufactured by a method that is described in detail later.

Figure 10:
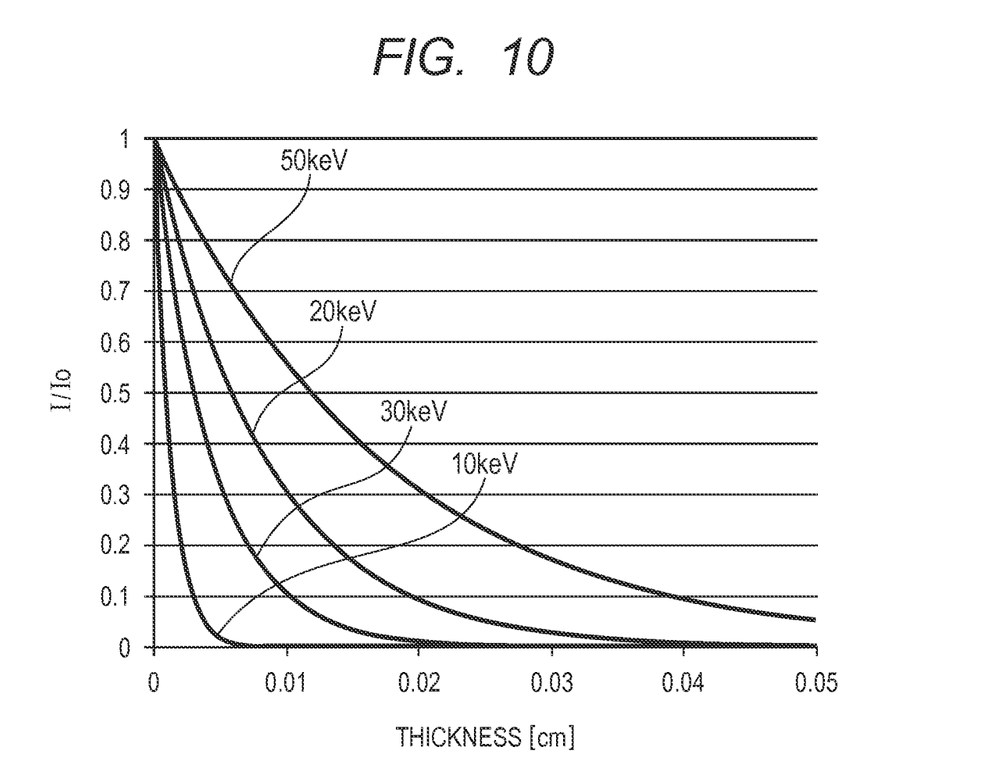
FIG. 10 is a graph showing energy-dependence of X-ray transmissivity of $SnO_2$.

It is preferred that the thickness of the $SnO_2$ semiconductor layer be 0.1 mm or more to 1 mm or less, and the thickness is more preferred to be 0.2 mm or more to 1 mm or less. In the above-mentioned radiation detecting element, it is preferred that the semiconductor layer have the thickness enough to absorb the radiation. FIG. 10 shows transmissivity of the X-ray calculated from the X-ray absorption coefficient of $SnO_2$. For example, in the case of the X-ray of 30 keV, about 90% of the X-ray can be absorbed with the thickness of 0.1 mm. Further, about 99% of the X-ray can be absorbed with the thickness of 0.2 mm. In the case of using the X-ray of about 10 keV to 80 keV, it is preferred that the thickness of $SnO_2$ be 0.2 mm or more. On the other hand, toward downsizing the apparatus and enhancing the charge collecting efficiency, it is preferred that the thickness of the semiconductor layer be thin, and specifically, the thickness is preferred to be 1 mm or less.

It is preferred that the semiconductor layer including $SnO_2$ according to this embodiment have μτ product (mobility lifetime product) of $10^{-6}$ cm$^2$/V or more. In particular, the μτ product is preferred to be $10^{-3}$ cm$^2$/V or more. By using this $SnO_2$ semiconductor, an element that is highly sensitive under low bias voltage can be achieved. The μτ product can be estimated from, for example, photocurrent evaluation under an ultraviolet excitation. The μτ product can be calculated by the following expression (1).

$$\mu\tau = \frac{IW}{VeLF_0} \quad (1)$$

where I is a photocurrent value, V is a bias voltage, W is a distance between electrodes, L is a width of the electrode, $F_0$ is an irradiation light flux, and e is an elementary charge.

Alternatively, the μτ product can be estimated from a time-of-flight method or bias voltage dependence of the charge collection efficiency.

An electrode material that can be used for the electrodes 3 and 4 (electrodes 8 and 9) includes Au, Pd, Ni, carbon, Ti, Al, Cu, and the like. As a method of forming the electrodes, an evaporation method, a sputtering method, a non-electrolytic plating method, or a printing method can be used.

As the ammeter 6, one used for an arbitrary current measuring method can be used, in which measuring voltage across a resistor, reading the charge amount accumulated in a capacitor, a current-voltage conversion amplifier, or a charge-sensitive amplifier can be used. Further, a method of reading a temporally averaged current value as a radiation intensity signal or a method of converting current pulse generated by the radiation irradiation into pulsed voltage and counting the number of pulses can be used. In addition, analysis of energy of the radiation can also be performed by using a pulse-height analyzer.

An example of using $SnO_2$ for the radiation detecting element includes, for example, material described in International Publication No. 2002/063340. However, although $SnO_2$ is mentioned as one of the selections for the material for detecting the radiation in International Publication No. 2002/063340, there is no description about the resistance of $SnO_2$ used. Further, a specific detecting method of detecting carriers excited near a surface of a semiconductor layer is used.

In contrast to this, in the radiation detecting apparatus according to this embodiment, the resistivity of the semiconductor layer including $SnO_2$ is $10^7$ Ω·cm or more. Therefore, a radiation detecting element having small dark current as described above can be achieved. Further, the radiation detecting apparatus according to the present invention also differs from International Publication No. 2002/063340 in that, when the semiconductor layer 1 is irradiated with the radiation, the charges generated in the semiconductor layer 1 are detected as the electrical signal.

Further, a radiation image sensor (image forming apparatus) can be achieved by arranging the above-mentioned radiation detecting elements including $SnO_2$ in an arrayed manner. A two-dimensional image can be formed based on current values (charge amounts) measured by the elements. The image forming apparatus includes an image forming portion that forms the two-dimensional image based on the signal obtained from the charges generated in the semiconductor layer 1 when the semiconductor layer 1 is irradiated with the radiation.

Material for Detecting Radiation—$SnO_2$ Crystal

A tin oxide ($SnO_2$) is a rutile-type tetragonal system crystal, which is known as semiconductor having a bandgap of about 3.6 eV. The tin oxide ($SnO_2$) is an environment-friendly material composed of non-toxic elements, which is a highly practical material with a low material cost. Further, the electron mobility at the room temperature has been reported to be 200 cm$^2$/Vsec to 250 cm$^2$/Vsec, and this large mobility is suitable for achieving a high-performance radiation detecting element.

Further, $SnO_2$ includes, as a main component, a heavy element of Sn having the atomic number of 50 with a relatively large density of 6.95 g/cm$^3$, and hence the absorption performance for the radiation (X-ray) is high. As described earlier with reference to FIG. 10, $SnO_2$ has relatively large X-ray absorption performance, and hence $SnO_2$ can absorb the X-ray even if the thickness is thin compared to the case of using Si or Ge. This enables downsizing (thinning) the apparatus. In this manner, $SnO_2$ has physical properties desired as the radiation detecting material; however, there is virtually no example applying this material to the radiation detecting element. One of the reasons is because the related art was not able to achieve $SnO_2$ having a high resistivity. When a material having a low resistivity is used for the material for detecting the radiation, a current signal from the charges generated at the time of the radiation irradiation is under the veil of the dark current (current at the time of the non-irradiation), and hence the current signal cannot be detected. That is, in the past, $SnO_2$ that was difficult to be highly resistive was not proper as the material for detecting the radiation.

In general, it has been known that, in a process of manufacturing $SnO_2$, excess tin (interstitial Sn) or oxygen deficiency (oxygen vacancy) is formed in the crystal, so that n-type semiconductor is formed due to carriers generated accordingly. Typically, the resistivity is $10^4$ Ω·cm or less. For example, a description of the tin oxide in physics and chemistry dictionary says that $SnO_2$ is electro-conductive material and its specific resistivity is about $10^2$ Ω·cm. This resistivity is insufficient as the radiation detecting element. That is, it is hard to use the related-art and general $SnO_2$ crystal as the material for detecting the radiation.

As a method of obtaining highly resistive $SnO_2$, doping impurities of a heterogeneous element, degrading the crystallinity, achieving sintered green compact with insulator deposited in a crystal grain boundary, and the like are conceived; however, these methods cause degradation of the electron mobility, leading to degradation of the sensitivity as the radiation detecting element, and hence these methods are not appropriate. That is, it is preferred that the impurities of the heterogeneous element in the $SnO_2$ crystal be as little as possible. In this embodiment, it is preferred that the impurity amount of the heterogeneous element be 0.1 atom % or less, and it is more preferred that the impurity amount of the heterogeneous element be 0.001 atom % or less.

The inventors of the present invention earnestly studied a method of manufacturing the highly resistive $SnO_2$, and developed a method of creating $SnO_2$ having the resistivity of $10^7$ Ω·cm or more with excellent reproducibility. Further, the inventors of the present invention found that this highly resistive $SnO_2$ showed a large conductivity change under the radiation irradiation. That is, the inventors of the present invention found that the highly resistive $SnO_2$ according to this embodiment can function as the material for detecting the radiation.

Method of Manufacturing $SnO_2$ Semiconductor

Figure 4:
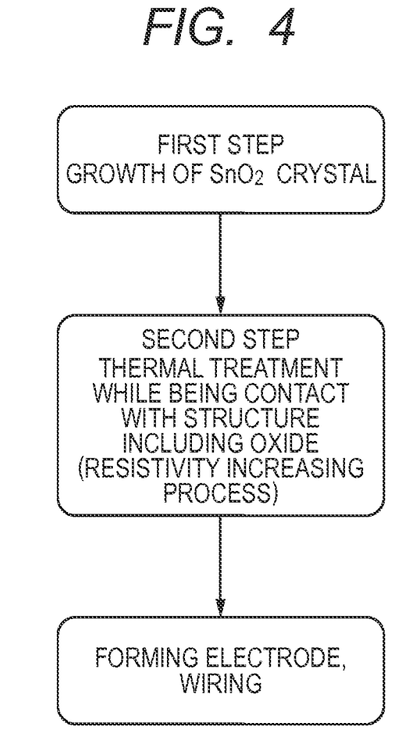
FIG. 4 is an operation flowchart illustrating a method of manufacturing the X-ray detecting element according to the embodiment of the present invention.

As illustrated in FIG. 4, the method of manufacturing $SnO_2$ semiconductor for detecting the radiation according to this embodiment includes a first step of performing growth of a $SnO_2$ crystal and a second step (resistivity enhancement process) of performing thermal treatment in a state in which the $SnO_2$ crystal is brought into contact with a structure including an oxide.

More specifically, the first step is a step of manufacturing the $SnO_2$ semiconductor having the resistivity of $10^6$ Ω·cm or less, and the second step is a step of performing the thermal treatment at the temperature of 1,000° C. or more in a state in which the $SnO_2$ semiconductor and the structure including the oxide are brought into contact with each other to increase the resistivity of the $SnO_2$ semiconductor up to $10^7$ Ω·cm or more. When the $SnO_2$ semiconductor having the resistivity of $10^6$ Ω·cm or less is available, the first step can be omitted.

Each of the steps is described below.

(1) First Step: Production of $SnO_2$ Crystal

Firstly, the $SnO_2$ crystal is produced. It has been known that the $SnO_2$ crystal can be produced by such a method as the vapor phase growth method, the vapor phase reaction method, and the flux method. For example, the growth method for a $SnO_2$ single crystal is described in detail in Journal of the Electrochemical Society Vol. 123, No. 7, p. 199 (1976). In this document, methods including the vapor phase growth method using $SnO_2$ as the raw material, the vapor reaction growth method using $SnCl_4$ as the raw material, the vapor phase reaction method using the metal raw material of Sn, and the flux method using the raw material of $SnO_2$ and the flux of $Cu_2O$ are introduced. Other methods including the evaporation method, the CVD method, the sol-gel method, the sputtering method, the spray method, and the printing method have also been known as methods for manufacturing a $SnO_2$ film.

The $SnO_2$ crystal produced by the above-mentioned method typically has the resistivity of $10^6$ Ω·cm or less. In Journal of the Electrochemical Society Vol. 123, No. 7, p. 299 (1976), the electrical property of $SnO_2$ is described in detail. According to this document and the cited references thereof, the resistivity of the $SnO_2$ crystal produced by the vapor reaction growth method, which is known to obtain a quality crystal, is 0.1 Ω·cm to 0.3 Ω·cm (from Japanese Journal of Applied Physics Vol. 10, p. 727 (1971)) and $6 \times 10^5$ Ω·cm (from Journal of the Electrochemical Society Vol. 116, No. 9, p. 1269 (1969)).

(2) Second Step: Resistivity Enhancement Process

Following the first step, the thermal treatment process (resistivity enhancement process), which is the feature of this embodiment, is performed. Prior to this process, processes of shaping, polishing, and cleaning can be performed as appropriate.

The $SnO_2$ crystal that has the resistivity of $10^6$ Ω·cm or less before performing this process (resistivity enhancement process) can be made highly resistive after performing this process, such that the resistivity is increased up to $10^7$ Ω·cm or more.

Figure 1:
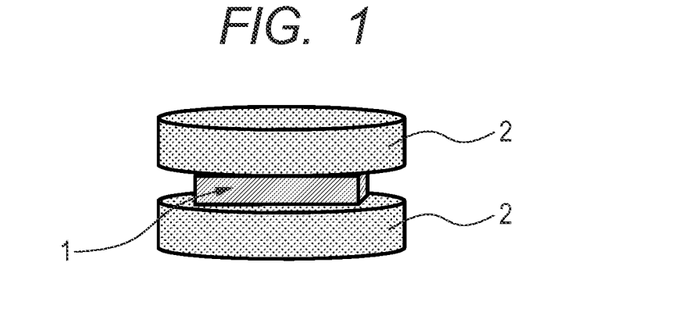
FIG. 1 is a schematic diagram illustrating an arrangement of $SnO_2$ (a form of a tin oxide) and a structure (green compact) including an oxide in a thermal treatment process (resistivity enhancement process) according to an embodiment of the present invention.

As illustrated in FIG. 1, in the resistivity enhancement process, the thermal treatment is performed in a state in which the $SnO_2$ crystal 1 is brought into contact with a structure 2 of platinum or a solid oxide including an oxide other than the tin oxide. As the structure 2 including the oxide, a solid material obtained by solidifying oxide powder, green compact obtained by pelletizing oxide powder, sintered compact, oxide powder, an oxide crystal plate, or the like can be used.

In this case, as the oxide, there may be used, for example, Mg, $SiO_2$, $Al_2O_3$, $Y_2O_3$, $Sc_2O_3$, $TiO_2$, $Ga_2O_3$, $ZrO_2$, $Nb_2O_5$, $MoO_3$, $HfO_2$, $Ta_2O_5$, $WO_3$, $In_2O_3$, $Tb_4O_7$, $Lu_2O_3$, or $Bi_2O_3$. In addition, a mixture or compound thereof may be used.

In particular, among the above materials, it is preferred to use $In_2O_3$, $Al_2O_3$, $Tb_4O_7$, or $Sc_2O_3$, because these materials can reproducibly produce the $SnO_2$ crystal with a high resistivity.

Further, from an aspect to achieve highly sensitive X-ray detecting element using the $SnO_2$ crystal, it is preferred to use $Y_2O_3$, $TiO_2$, $ZrO_2$, $Al_2O_3$, or $In_2O_3$ among the above materials.

In particular, from an aspect that an X-ray detecting element having a large on-off ratio (ratio of current under X-ray irradiation and the dark current) can be achieved, it is preferred to use $Y_2O_3$, $ZrO_2$, $Al_2O_3$, $In_2O_3$, or $Tb_4O_7$ among the above materials.

In particular, from an aspect that an X-ray detecting element with a rapid current recovery after stopping the X-ray irradiation can be achieved, it is preferred to use $Al_2O_3$, $In_2O_3$, $HfO_2$, or $Sc_2O_3$ among the above materials.

From the above descriptions, it is preferred that the solid oxide be a solid metal oxide including at least one element of Y, In, and Al.

In order to make the $SnO_2$ crystal highly resistive in a sufficient manner, it is preferred that the temperature of the thermal treatment in this process (resistivity enhancement process) be 1,000° C. or more. Further, as a condition for preventing dissolution or sublimation of the $SnO_2$ crystal, it is preferred that the temperature of the thermal treatment be 1,500° C. or less. In particular, it is preferred that the temperature of the thermal treatment be in a range from 1,200° C. to 1,300° C. It is preferred that the atmosphere of the thermal treatment include oxygen. For example, the atmosphere includes air atmosphere, oxygen atmosphere, and mixed atmosphere of oxygen and inert gas. This enables the oxidized state of $SnO_2$ to be maintained, and hence the reproducibility of this process is improved.

With respect to the $SnO_2$ crystal in a plate shape or a rod shape, in order to obtain a sufficient contact area between the oxide and the $SnO_2$, it is preferred to perform the thermal treatment in a state in which the $SnO_2$ is sandwiched by the oxides up and down as illustrated in FIG. 1. Alternatively, the oxide can also be arranged to cover the entire circumference of the $SnO_2$.

In this method, it is not clear why the highly resistive $SnO_2$ crystal can be obtained at present. However, possible causes can be considered, such as a possibility that the metal element of the oxide material 2 that is brought into contact with the $SnO_2$ 1 is diffused to the $SnO_2$ crystal so that the carrier density is reduced or a possibility that the oxygen deficiency or the interstitial Sn is excluded under the proper thermal treatment environment. In addition to the high resistivity, the $SnO_2$ crystal formed by this method has high sensitivity at the time of X-ray irradiation that is described later. That is, both the high X-ray sensitivity and the small dark current can be achieved.

(3) Forming Element (Forming Electrodes, Wiring)

Following the resistivity enhancement process, the electrodes are formed on the $SnO_2$ crystal, and thus the radiation detecting element is achieved. As necessary, the radiation detecting element can be placed on another substrate or in a container, or a protective layer can be further provided.

Example 1

In Example 1, $SnO_2$ single crystal growth was performed by a method using $Cu_2O$ as the flux. A mixture of $Cu_2O$ and $SnO_2$ powder samples (99.99% of purity) with a ratio of 30 g and 1.1 g was put in a platinum crucible, and then the thermal treatment was performed at the temperature of 1,350° C. in the atmosphere. When cooling down the temperature, a slow cooling was performed at the rate of 3.66° C./h. Thereafter, the obtained coagulation was dipped into hot concentrated hydrochloric acid, and by dissolving and removing a colored compound (oxide of Cu), a clear and colorless crystal was obtained. The crystal was in a rod shape (prism shape) with a size of 0.3 mm×0.45 mm×2 mm.

Subsequently, as illustrated in FIG. 1, the above-mentioned $SnO_2$ single crystal was sandwiched by $Y_2O_3$ green compacts, and the thermal treatment (resistivity enhancement process) was performed for 24 hours at the temperature of 1,300° C. in the atmosphere. The $Y_2O_3$ green compact was obtained by pressing $Y_2O_3$ powder (99.99% of purity) and molding it in a pellet shape of 10 mmφ.

Lastly, as illustrated in FIG. 2, the electrodes were formed on a side surface of the rod-shaped crystal with a distance of 0.5 mm between the electrodes. A gold paste was used to form the electrodes.

An evaluation of the resistivity of the above-mentioned $SnO_2$ crystal showed an order of $10^9$ Ω·cm. Similarly, the resistivity of a sample (Comparative Example 1) with no resistivity enhancement process performed was evaluated, which showed an order of $10^4$ Ω·cm. That is, in this embodiment, about five digits of resistivity increase was confirmed by performing the resistivity enhancement process. When the $SnO_2$ crystal according to this embodiment was placed in the atmosphere for one month or more, the high resistivity was maintained as it was.

A result of an X-ray diffraction revealed that the obtained clear crystal was a $SnO_2$ crystal having a rutile structure. A composition analysis by the fluorescent X-ray apparatus and the secondary ion mass spectrometer (SIMS) showed that a Y amount in $SnO_2$ was equal to or below the detection limit ($10^{15}$ atoms/cm$^3$). That is, incorporation of the metal element (Y), which constituted the oxide ($Y_2O_3$) that was brought into contact with $SnO_2$ in the resistivity enhancement process, into $SnO_2$ was unrecognized, which was equal to or below the detection limit.

A mechanism of obtaining the high resistivity by the above-mentioned resistivity enhancement process is not clear at present. The following possibilities can be considered: (1) a possibility that an infinitesimal amount of (amount equal to or below the detection limit) Y is diffused into $SnO_2$ so that $Sn^{4+}$ is replaced by $Y^{3+}$, resulting in a decrease of the carrier density; and (2) a possibility that the oxygen deficiency or the interstitial Sn defect is reduced by the thermal treatment.

Subsequently, as illustrated in FIG. 2, the bias power source and the ammeter were connected between the electrodes, to achieve the X-ray detecting element. An area of the rod-shaped crystal between the electrodes was irradiated with the X-ray in a state in which the bias voltage was applied, and the X-ray response characteristic was evaluated. As illustrated in FIG. 2, in this example, a direction of flowing the current and a direction of irradiating the crystal with the X-ray are substantially perpendicular to each other. An X-ray source having W as a target was used for the X-ray irradiation. The acceleration voltage was 60 kV, and the excitation current was 1 mA. The sample was irradiated with an X-ray intensity of 110 mGy/sec.

Figure 5:
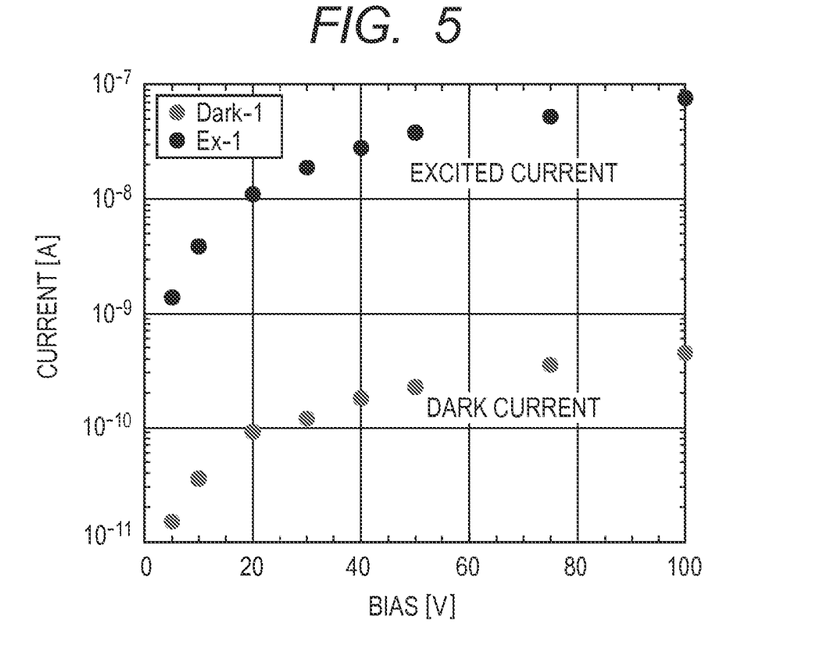
FIG. 5 is a graph showing X-ray response characteristics according to Example 1.

FIG. 5 shows voltage dependences of the dark current and the current (excited current) under the X-ray irradiation. For example, at the bias voltage of 100 V, the current of 80 nA was obtained at the time of the X-ray irradiation with respect to the dark current of 0.4 nA. That is, the on-off ratio is 200. It is found that the crystal has high sensitivity that can be used as the X-ray detecting element.

On the other hand, a similar evaluation of the sample according to Comparative Example 1 showed no difference in the current between the dark state and the excited state. This finds that the X-ray detecting element using the $SnO_2$ crystal functions properly by performing the resistivity enhancement process that is the feature of this embodiment.

Subsequently, an evaluation of ultraviolet response was performed. The area between the two electrodes was irradiated with the ultraviolet. The wavelength of the ultraviolet was 300 nm, and the intensity of the ultraviolet was $1.0 \times 10^{15}$ photon/cm$^2$/sec.

Figure 6:
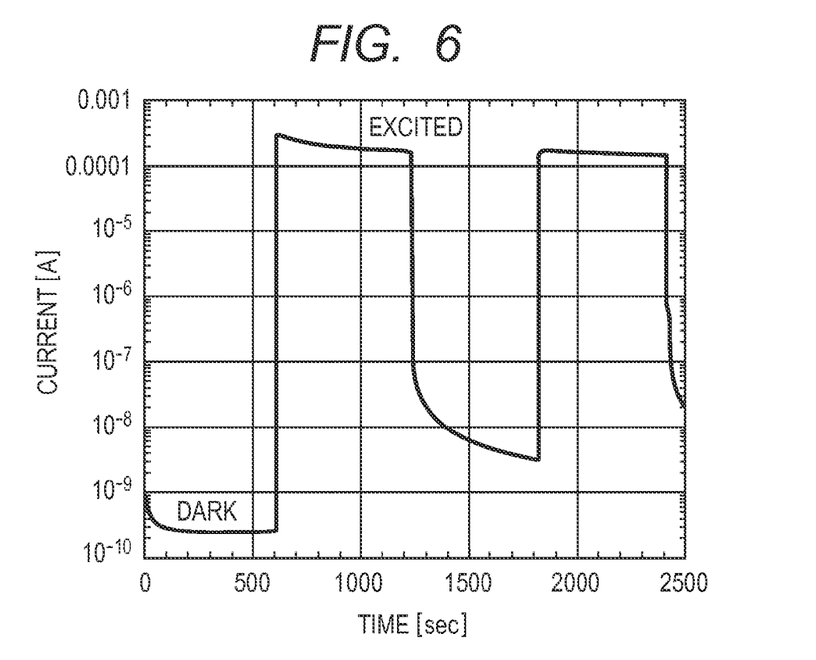
FIG. 6 is a graph showing ultraviolet response characteristics according to Example 1.

FIG. 6 shows a temporal change of the current value when the ultraviolet irradiation was switched on and off. After the ultraviolet irradiation, the current value showed an increase of five digits or more within a few tens of seconds, and then stabilized. After the ultraviolet was switched off, the current value showed a decrease of three digits or more within a few seconds, and recovered in a few minutes to the same current as that before the irradiation.

The saturated photocurrent value showed a value as large as 100 μA or more. The μτ product (mobility lifetime product) calculated from the photocurrent value was estimated to be about $10^{-2}$ [cm$^2$/V] to $10^{-3}$ [cm$^2$/V]. The following expression (1) was used to calculate the μτ product.

$$\mu\tau = \frac{IW}{VeLF_0} \quad (1)$$

where I is a photocurrent value, V is a bias voltage, W is a distance between the electrodes, L is a width of the electrode, $F_0$ is an irradiation light flux, and e is an elementary charge.

By performing the resistivity enhancement process, which is the feature of this example, the highly resistive $SnO_2$ crystal was able to be produced. By using the highly resistive $SnO_2$ crystal, an X-ray detecting element and the ultraviolet detecting element having a sufficient performance were able to be achieved.

Examples 2 to 9

Firstly, the $SnO_2$ crystal was produced by a method (flux method) similar to that of Example 1. Subsequently, the thermal treatment (resistivity enhancement process) was performed on the $SnO_2$ crystal in a state in which the $SnO_2$ crystal was brought into contact with a structure including an oxide. In this example, green compacts including various oxide materials were used (Example 2: $Al_2O_3$, Example 3: $Sc_2O_3$, Example 4: $TiO_2$, Example 5: $ZrO_2$, Example 6: $In_2O_3$, Example 7: $Tb_4O_7$, Example 8: $Lu_2O_3$, and Example 9: $HfO_2$). As Comparative Example 2, a green compact of $SnO_2$ was used. As Comparative Example 3, a Pt plate was used in lieu of the green compact.

In this process, the thermal treatment conditions such as temperature profile, atmosphere, and the like were set based on those of Example 1.

A result of performing the ultraviolet response evaluation by a method similar to that of Example 1 is shown in Table 1. The result shown in Table 1 is described below.

TABLE 1

| | Oxide | Resistivity (Ω·cm) | Dark current (A) | Photocurrent (A) | On-off ratio | Recover rate after 10 seconds (%) |
|---|---|---|---|---|---|---|
| Example 1 | $Y_2O_3$ | 1.3E+10 | 1.1E−10 | 3.6E−04 | 3.4E+06 | 98.92311 |
| Example 2 | $Al_2O_3$ | 6.2E+12 | 2.2E−13 | 1.6E−05 | 7.4E+07 | 99.99994 |
| Example 3 | $Sc_2O_3$ | 6.2E+11 | 2.2E−12 | 1.3E−05 | 6.1E+06 | 99.99954 |
| Example 4 | $TiO_2$ | 2.7E+07 | 5.0E−08 | 1.2E−04 | 2.4E+03 | 94.43966 |
| Example 5 | $ZrO_2$ | 5.9E+11 | 2.3E−12 | 1.2E−04 | 5.2E+07 | 98.92308 |
| Example 6 | $In_2O_3$ | 1.5E+13 | 9.1E−14 | 7.6E−06 | 8.3E+07 | 99.99999 |
| Example 7 | $Tb_4O_7$ | 2.1E+12 | 6.5E−13 | 2.5E−06 | 3.9E+06 | 99.98464 |
| Example 8 | $Lu_2O_3$ | 8.1E+10 | 1.7E−11 | 5.0E−07 | 3.0E+04 | 99.98963 |
| Example 9 | $HfO_2$ | 9.5E+11 | 1.4E−12 | 3.6E−08 | 2.5E+04 | 99.99988 |
| Comparative Example 2 | $SnO_2$ | 4.6E+04 | 2.9E−05 | 7.7E−05 | 2.6E+00 | 96.13095 |
| Comparative Example 3 | Pt | 2.2E+12 | 6.3E−13 | 1.9E−07 | 3.0E+05 | 99.99962 |

Regarding the resistivity of the $SnO_2$ semiconductor, it was found that Example 6 using $In_2O_3$ in the resistivity enhancement process showed the largest value, and Example 6 using $In_2O_3$ was preferred. Other than that, it was found that a high resistivity was obtained in Example 2 using $Al_2O_3$, Example 7 using $Tb_4O_7$, and Example 3 using $Sc_2O_3$, which were preferred. An X-ray detecting element having small dark current can be achieved by using the $SnO_2$ crystal according to these examples. On the other hand, in the case of Comparative Example 2 using $SnO_2$, it was found that the dark current was large due to the small resistivity of the $SnO_2$ semiconductor.

Regarding the photocurrent (current under X-ray irradiation) under the ultraviolet irradiation, it was found that Example 1 using $Y_2O_3$ showed the largest value, and Example 1 using $Y_2O_3$ was preferred. Other than that, Example 5 using $ZrO_2$, Example 4 using $TiO_2$, Example 2 using $Al_2O_3$, and Example 6 using $In_2O_3$ were preferred. An X-ray detecting element having high sensitivity (high current under X-ray irradiation) can be achieved by using the $SnO_2$ crystal according to these examples. On the other hand, it was found that, in Comparative Example 3 using Pt, the photocurrent was small and the sensitivity was low.

Regarding the characteristics of the X-ray detecting element, the on-off ratio (current under X-ray irradiation/dark current) is important as an index of the characteristic. It was found that the largest on-off ratio was obtained in Example 6 using $In_2O$, which was preferred. Other than that, Example 2 using $Al_2O_3$, Example 5 using $ZrO_2$, Example 7 using $Tb_4O_7$, and Example 1 using $Y_2O_3$ were preferred. An X-ray detecting element having a large on-off ratio can be achieved by using the $SnO_2$ crystal according to these examples.

In some cases, the X-ray detecting element may need high response when performing an evaluation in a repeated manner within a short period of time depending on the usage. On the right-end column of Table 1, a result of evaluating the recovery rate of the current value after stopping the ultraviolet irradiation is shown. The recovery rate in 10 seconds after stopping the ultraviolet irradiation is shown. Specifically, the recovery rate is represented by the following expression (2).

$$100-100*(I\_10s-Id)/(I\_on-Id) \quad (2)$$

where Id is dark current, I_on is current under irradiation, and I_10s is current in 10 sec after stopping ultraviolet irradiation. That is, the larger recovery rate indicates the faster current recovery.

It was found that Example 6 using $In_2O_3$ showed the fastest current recovery rate, and Example 6 using $In_2O_3$ was preferred. Other than that, Example 3 using $Al_2O_3$, Example 9 using $HfO_2$, and Example 4 using $Sc_2O_3$ were preferred. An X-ray detecting element having an excellent response speed can be achieved by using the $SnO_2$ crystal according to these examples.

From the above aspects, it was found that Example 6 using $In_2O_3$, Example 3 using $Al_2O_3$, and Example 1 using $Y_2O_3$ had an excellent overall performance, and these examples were preferred.

Example 10

Example 10 is an example in which the $SnO_2$ crystal was produced by a method (vapor phase reaction method) using Sn metal as the raw material.

Firstly, 10 g of Sn powder (99.999% of purity) was put in an aluminum crucible having a capacity of 15 cc, the crucible is was covered with a lid, and then the thermal treatment was performed in the atmosphere for two hours at the temperature of 1,350° C. In the crucible after the thermal treatment, a clear needle-shaped crystal or a clear plate-shaped crystal was obtained.

Subsequently, with respect to a sample of the plate-shaped crystal having a size of 2 mm×2 mm×0.5 mm, the thermal treatment (resistivity enhancement process) using the $Y_2O_3$ green compact was performed by a method similar to that of Example 1. Following the thermal treatment, the electrodes were formed with a distance of 0.5 mm between the electrodes by using an Au paste on the upper surface of the plate-shaped crystal.

Five $SnO_2$ crystals according to this example formed by the above-mentioned method were prepared, and the evaluation of the resistivity was performed. A result of the evaluation showed that the resistivity was in a range from $10^9$ Ω·cm to $10^{11}$ Ω·cm.

In the meanwhile, as Comparative Example 4, samples on which the resistivity enhancement process was not performed were prepared, and the evaluation of the resistivity was performed. A result of the evaluation showed that the resistivity was distributed in a range from $10^3$ Ω·cm to $10^9$ Ω·cm depending on the samples.

From the above aspects, in this example as well, it was found that the high resistivity was obtained in the $SnO_2$ crystal by the thermal treatment using the $Y_2O_3$ green compact. In addition, it was found that the resistivity that had been distributed in a broad range before the resistivity enhancement process fell within a narrow range after the thermal treatment.

An evaluation of the X-ray response by a method similar to that of Example 1 confirmed that an X-ray response characteristic similar to that of Example 1 was obtained. Further, an evaluation of an impurity amount by the fluorescent X-ray showed that amounts of the elements other than Sn and O were equal to or below the detection limit.

In this example, the highly resistive $SnO_2$ crystal was able to be produced by performing the resistivity enhancement process on the plate-shaped $SnO_2$ crystal produced by using the vapor phase reaction method. An X-ray detecting element having a sufficient performance was able to be achieved by using the highly resistive plate-shaped $SnO_2$ crystal.

Example 11

In Example 11, the clear plate-shaped crystal having a size of 3 mm×2 mm×0.3 mm was used among the $SnO_2$ crystals produced by a method similar to that of Example 10. The resistivity enhancement process was performed by using the $Y_2O_3$ green compact by a method similar to that of Example 1.

Thin film electrodes (the upper electrode and the lower electrode illustrated in FIGS. 3A and 3B) of Au (50 nm)/Ti (5 nm) were formed on upper and lower surfaces of the sample by the sputtering method. A dimension of each of the upper and lower electrodes was 3 mm². The bias power source and the ammeter were connected to these electrodes.

As illustrated in FIGS. 3A and 3B, the sample was irradiated with the X-ray from the above, and the response characteristic was evaluated. The X-ray was collimated to a diameter of 0.8 mm with a collimator, and transmitted through the electrode from the upper surface of the sample, so that the $SnO_2$ was irradiated with the X-ray. That is, as illustrated in FIG. 3B, in this example, the upper electrode and the lower electrode are arranged in parallel and facing each other, so that the direction of flowing the current and the direction of irradiating the $SnO_2$ with the X-ray are substantially parallel to each other. The other conditions for the X-ray irradiation evaluation were set based on those of Example 1.

Figure 7:
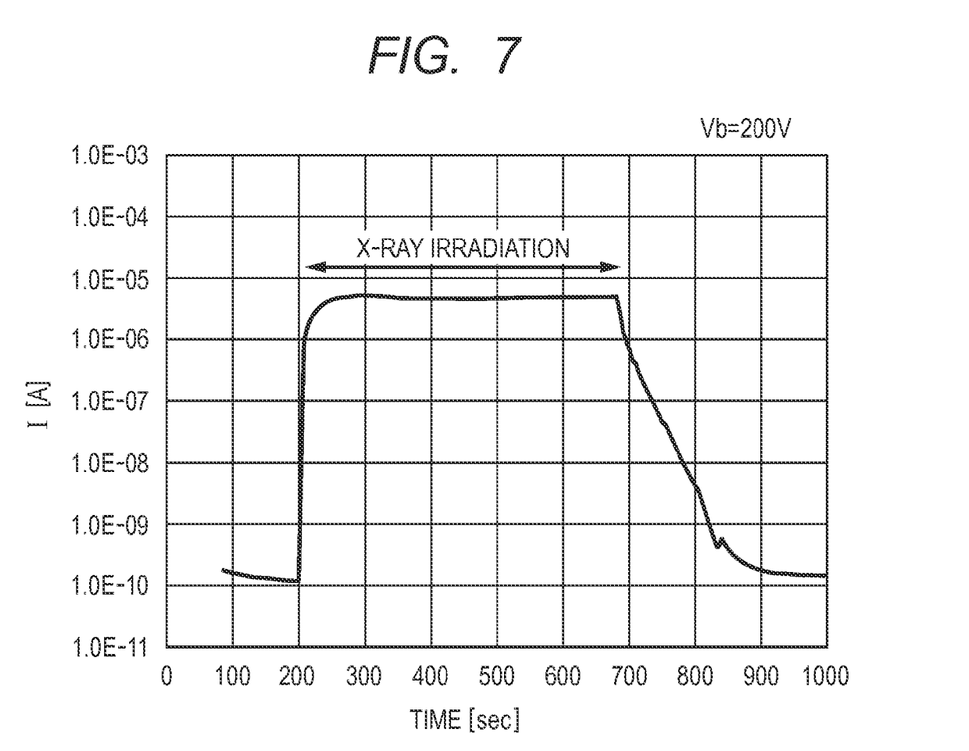
FIG. 7 is a graph showing X-ray response characteristics according to Example 11.

FIG. 7 shows a change of the current at the time of the X-ray irradiation. The bias voltage was 200 V. The current of 5 μA was obtained at the time of the X-ray irradiation with respect to the dark current of 0.2 nA under the X-ray non-irradiation. That is, an on-off ratio as large as 25,000 was obtained.

As illustrated in FIGS. 3A and 3B, in an element in which the first electrode and the second electrode were arranged sandwiching the semiconductor layer, an X-ray detecting element having a sufficient performance was able to be achieved. In this example, the X-ray irradiation area was limited to an area of the electrode, and hence the detected signal was caused by charges generated in the $SnO_2$ semiconductor. That is, the charges generated in the $SnO_2$ crystal are detected as the electrical signal through the electrodes arranged on the upper and lower surfaces of the crystal. With this configuration, an X-ray detecting element having a high on-off ratio was able to be achieved.

Example 12

Example 12 is an example in which a response to a pulsed X-ray was evaluated by using the X-ray detecting element produced by a method similar to that of Example 11.

The pulsed X-ray had a pulse width of 0.3 sec. In a current measurement, a current-voltage conversion amplifier was connected to the ammeter 6 illustrated in FIGS. 3A and 3B, and an output voltage of the current-voltage conversion amplifier was measured by an oscilloscope.

Figure 8:
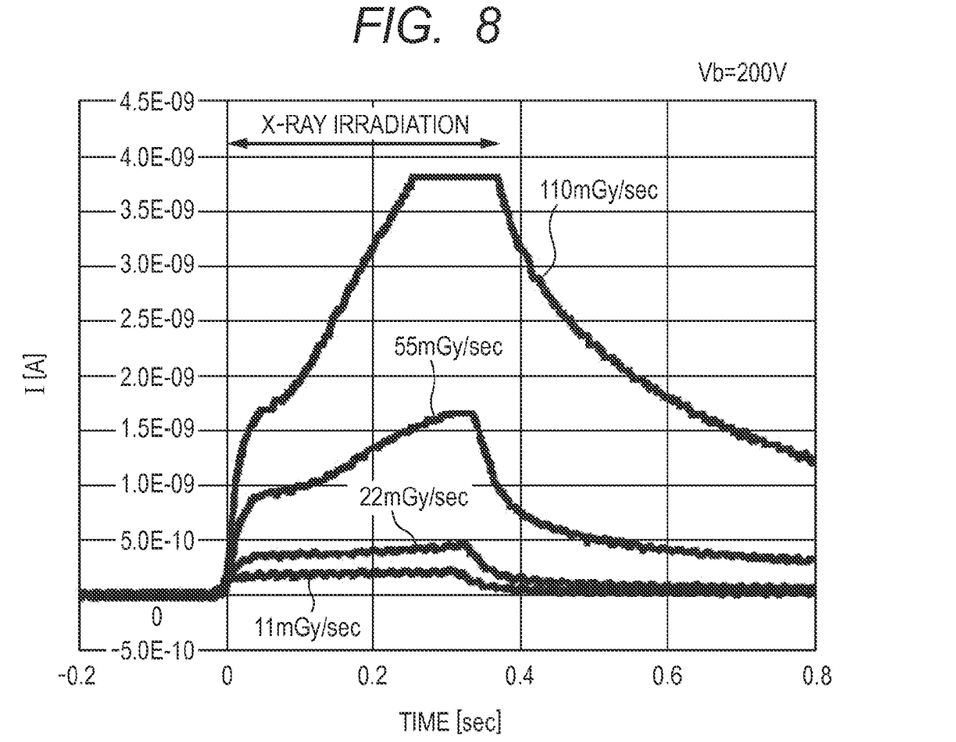
FIG. 8 is a graph showing pulsed X-ray response characteristics according to Example 12.

FIG. 8 shows a temporal change of the current value at the time of the X-ray irradiation. The X-ray irradiation time period was between 0 sec to 0.3 sec in FIG. 8. Four data with different X-ray irradiation intensities are shown in FIG. 8. Focusing on the data of the irradiation intensity of 55 mGy/sec, it was found that the current reached about 0.9 nA (primary plateau current) in the time window of 0 sec to 10 msec, maintained the level up to a few 100 msec, and then increased again.

Figure 9:
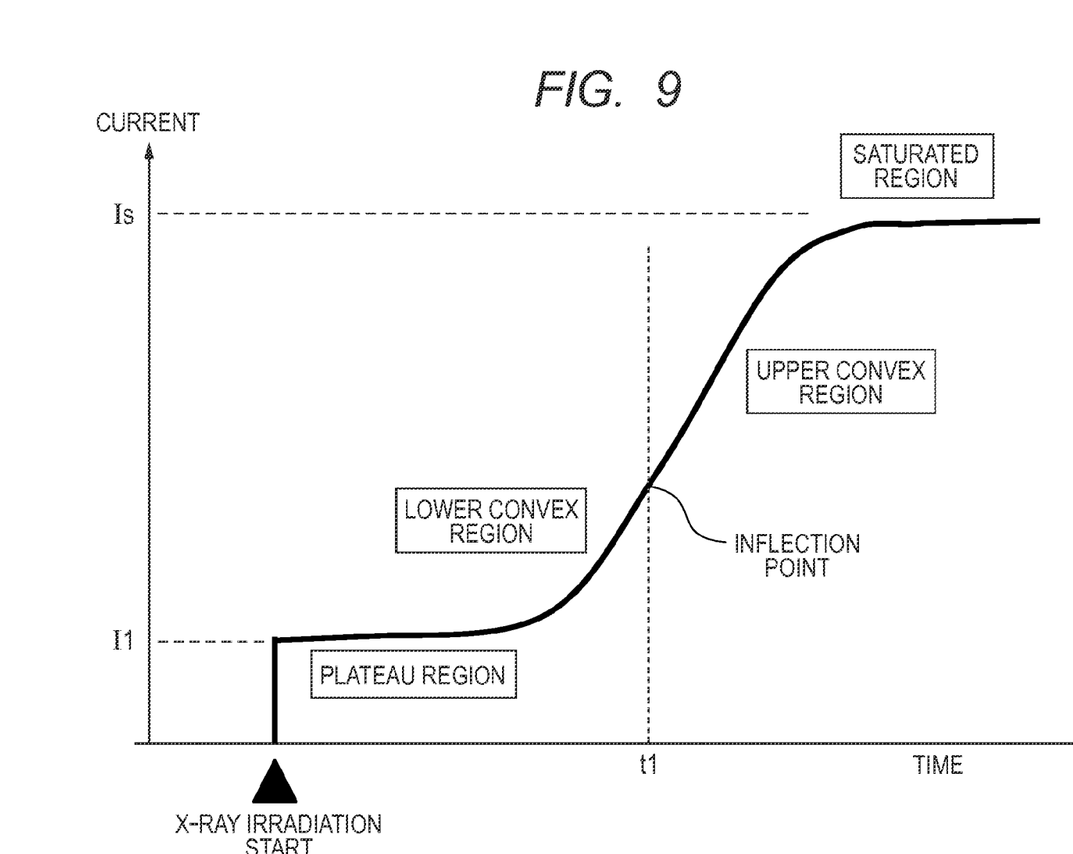
FIG. 9 is a schematic diagram illustrating a temporal change of photocurrent response.

FIG. 9 shows characteristics of this behavior. That is, after the X-ray irradiation, the current increased up to the primary plateau current (I1) in a few 10 msec, and then reached a saturated current value (Is) through a plateau region, a lower convex region, an inflection point (t1), and an upper convex region.

The primary plateau current (I1) shows a behavior virtually in proportion to the X-ray irradiation intensity. Therefore, an X-ray intensity evaluation can be performed by using the primary plateau current I1. The evaluation can be performed in a relatively short period of time by using the primary plateau current.

The X-ray intensity evaluation can also be performed by using the saturated current value (Is). The saturated current value Is behaves as γ-th power of the X-ray intensity, and hence the X-ray intensity can be evaluated by using this correlation. γ is in a range from 0.7 to 1. The saturated current value (Is) necessitates a time period of a few seconds or more in order for the value to be saturated. However, the saturated current value (Is) has a large current value compared to the primary plateau current I1, and hence the evaluation can be performed with high accuracy. On the other hand, when the saturated current value Is is used, the time is required until the current saturation, and hence when the evaluation is to be performed in a short period of time, it is preferred to use the primary plateau current I1. That is, the saturated current value Is can be used when the sensitivity matters, and the primary plateau current I1 can be used when the response speed matters.

Further, the time of the inflection point (t1) is decreased as the X-ray irradiation intensity is increased. By using this phenomenon, the X-ray irradiation intensity can be estimated from a position of the inflection point (t1).

Moreover, the current of the plateau region can be accurately read out by setting the X-ray irradiation intensity with which the radiation detecting element is irradiated to a value equal to or below a rated value and further setting a time for reading out the current corresponding to the rated value.

As shown in FIG. 9, as the X-ray irradiation intensity is increased, the plateau region (0 to t1) is decreased, and hence by setting an upper limit of the X-ray irradiation intensity in advance, a time range for reading out the current corresponding to the upper limit can be set. With this method, a value of the primary plateau current I1 can be accurately evaluated by reading out the current value of the plateau region.

Although it depends on the details such as the condition for preparing the sample, when the semiconductor layer is irradiated with the radiation having the absorbed dose per second of 50 mGy/sec or less, it is preferred to detect the electrical signal within 0.3 sec after the irradiation. For example, the current of the plateau region can be accurately evaluated by setting the X-ray irradiation intensity with which the radiation detecting element is irradiated to 55 mGy/sec or less and performing the current evaluation within 100 msec after starting the X-ray irradiation. By using this method, the primary plateau current I1 can be accurately read out without reading the currents of the upper convex region and the saturated region, and hence a highly reliable evaluation can be performed.

The radiation detecting apparatus according to the present invention, which uses $SnO_2$, can be used for a radiation image sensor for medical and industrial applications using radiation such as X-ray and γ-ray, and a measurement instrument for high energy physics and space applications.

The highly resistive $SnO_2$ semiconductor formed by the manufacturing method according to the present invention can be used as a material for detecting the radiation, a material for a UV optical sensor, a maternal for a chemical sensor, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-130012, filed Jun. 20, 2013, which is hereby incorporated by reference herein in its entirety.

What is claimed is:

1. A radiation detecting element comprising:
a semiconductor layer including a tin oxide crystal; and
a detecting unit configured to detect, as an electrical signal, charges generated in the semiconductor layer when the semiconductor layer is irradiated with radiation,
wherein a resistivity of the semiconductor layer is $10^7$ Ω·cm or more.

2. The radiation detecting element according to claim 1, wherein the tin oxide crystal includes $SnO_2$.

3. The radiation detecting element according to claim 2, wherein:
the semiconductor layer includes a first surface and a second surface that differs from the first surface; and
the detecting unit includes:
a first electrode arranged on the first surface; and
a second surface arranged on the second surface.

4. The radiation detecting element according to claim 1, wherein a thickness of the semiconductor layer is 0.2 mm or more to 1 mm or less.

5. The radiation detecting element according to claim 1, wherein:
the semiconductor layer includes a first surface and a second surface that differs from the first surface; and
the detecting unit includes:
a first electrode arranged on the first surface; and
a second surface arranged on the second surface.

6. The radiation detecting element according to claim 5, wherein the first surface and the second surface face each other.

7. The radiation detecting element according to claim 1, wherein the detecting unit is configured to detect the electrical signal within 0.3 sec after irradiation when the semiconductor layer is irradiated with radiation with an absorbed dose per second of 50 mGy/sec or less.

8. An image forming apparatus comprising:
the radiation detecting element according to claim 1; and
an image forming portion configured to form image information based on the electrical signal.

9. A method of manufacturing semiconductor including tin oxide, the method comprising:
heating a tin oxide crystal having a resistivity of $10^6$ Ω·cm or less in a state in which the tin oxide crystal is brought into contact with one of platinum and a solid oxide including an oxide other than the tin oxide; and
obtaining the tin oxide having a resistivity of $10^7$ Ω·cm or more.

10. The method according to claim 9, wherein the solid oxide includes a solid metal oxide.

11. The method according to claim 10, wherein the solid metal oxide includes at least one element selected from the group consisting of Y, In, and Al.

12. The method according to claim 10, wherein the solid metal oxide includes metal oxide powder.

13. The method according to claim 12, wherein the solid metal oxide includes a green compact of the metal oxide powder.

14. The method according to claim 9, wherein the tin oxide crystal includes $SnO_2$.

15. The method according to claim 9, wherein the heating a tin oxide crystal includes heating the tin oxide crystal at a temperature of 1,000° C. or more.

16. A method of manufacturing a radiation detecting element, the method comprising forming a first electrode and a second electrode on semiconductor including tin oxide manufactured by the method according to claim 9.

17. A method of manufacturing an image forming apparatus, the method comprising connecting electrically an image forming portion, which is configured to form image information based on an electrical signal detected by a radiation detecting element manufactured by the method according to claim 16, to the radiation detecting element.

* * * * *